United States Patent [19]

Jerman

[11] Patent Number: 5,338,400
[45] Date of Patent: Aug. 16, 1994

[54] MICROMACHINING PROCESS FOR MAKING PERFECT EXTERIOR CORNER IN AN ETCHABLE SUBSTRATE

[75] Inventor: John H. Jerman, Palo Alto, Calif.

[73] Assignee: IC Sensors, Inc., Milpitas, Calif.

[21] Appl. No.: 23,188

[22] Filed: Feb. 25, 1993

[51] Int. Cl.$^5$ .............. H01L 21/306; B44C 1/22; C03C 15/00

[52] U.S. Cl. .................. 156/647; 156/643; 156/651; 156/644; 156/657; 156/661.1; 156/662

[58] Field of Search .......... 156/643, 647, 651, 654, 156/659.1, 661.1, 662, 657, 644, 657; 437/65, 66, 927

[56] References Cited

U.S. PATENT DOCUMENTS

| | | | |
|---|---|---|---|
| 4,286,374 | 9/1981 | Hantusch | 437/65 |
| 4,417,946 | 11/1983 | Bohlen et al. | 156/643 |
| 4,662,984 | 5/1987 | Ohtake et al. | 156/637 |
| 4,733,823 | 3/1988 | Waggener | 156/647 X |
| 4,869,780 | 9/1989 | Yang et al. | 156/648 X |
| 4,981,552 | 1/1991 | Mikkor | 156/651 X |
| 5,124,281 | 6/1992 | Ackerman et al. | 437/927 X |
| 5,182,227 | 1/1993 | Matsukawa | 437/72 |
| 5,204,690 | 4/1993 | Lorenze et al. | 156/647 X |

OTHER PUBLICATIONS

Leone et al., Fabricating Shaped Grid and Aperture Holes, IBM Technical Disclosure Bulletin, vol. 14, No. 2, Jul. 1971, pp. 417–418.

*Primary Examiner*—William Powell
*Attorney, Agent, or Firm*—Skjerven, Morrill, MacPherson, Franklin & Friel

[57] ABSTRACT

A process for forming a three-dimensional structure etched in a substrate with perfect convex corners includes partitioning the structure into two features such that the exterior corners are formed by the intersection of the two features; etching the first feature; forming an etch mask on the surface and on the substrate of the etched first feature; opening a window in the etch mask on the substrate to define the second feature; and etching the second feature, thereby obtaining the desired structure.

13 Claims, 3 Drawing Sheets

MICROMACHINING PROCESS FOR MAKING PERFECT EXTERIOR CORNER IN AN ETCHABLE SUBSTRATE

BACKGROUND OF THE INVENTION

1. Field of the Invention

This invention relates to the field of forming three-dimensional structures in an etchable crystalline substrate material, in particular to the formation of perfect exterior corners intersected by features formed in the material using micromachining.

2. Description of Prior Art

The ability to fabricate precise, three-dimensional structures in an etchable substrate material, particularly in silicon, relies to a large degree on the ability to perform so-called anisotropic etching of the single crystal silicon substrate. Anisotropic etches have the property of etching certain crystallographic planes of silicon much more rapidly than others by using some etchants such as mixtures of KOH and water or mixtures of ethylene diamine, pyrocatechol, and water. All of these etches etch the {111} silicon plane much more slowly than the other low order {100} or {110} planes.

The two most common surface orientations of silicon wafers are (100) and (111). Since the etch rate of {111} planes is so low, (100) silicon is the preferred orientation for device fabrication. In (100) silicon, a flat is provided on each wafer along a <110> direction. In this orientation, the {111} planes intersect the (100) surface parallel and perpendicular to the wafer flat, at an angle of 54.74° with respect to the surface as shown in FIG. 1A in cross section.

If an opening in an etch mask is opened to form a rectangle, an anisotropic etchant will etch down exposing the {111} planes, to form a V-grove as shown in FIG. 1A and 1B in a plan view.

If a window in an etch mask is formed which is more complicated in shape than a rectangle, any convex protrusion will etch back to the "farthest" {111} plane given enough time, as shown in FIGS. 2A and 2B.

If one wants a convex corner, for example, at point A shown in FIG. 2B, use this exact L-shape as the etch mask, and put the substrate in KOH and water, the corner is etched back as shown in FIG. 3A and the protruding mask feature breaks off. So if it is desirable to have a convex corner which is not etched back, a so-called corner compensation technique may be used, in which an additional mask feature is added to the corner, which etches back just the right amount to leave the desired three-dimension feature at the exterior corner. One such corner compensation pattern is to add a square protrusion at the exterior corner as shown in FIG. 3B. As the etch proceeds downward, this additional feature etches back at the correct rate to leave the desired corner feature. This type of corner compensation has been long known.

However, with such corner compensation, the perfect intersection can only happen at a particular depth, which is the depth for which the correct corner compensation has been provided. In other words, the depth has to exactly match this additional mask feature, and the moment of perfect intersection (depth) is very short and hard to control. Furthermore, one may sometimes want a groove A to be very shallow and intersect a much deeper groove B as shown in FIG. 3C. For example, groove A is 10 microns wide and about 7 microns deep, and groove B can be 100 microns deep and 140 microns wide. In such a case, with the corner compensation scheme one would have to add a very large corner compensator feature to the corner, but normally there is no room for this. The corner compensation therefore cannot be used in some circumstances.

Another related problematic situation is when it is desired to form a through hole in a wafer by etching simultaneously from the back and front sides of the wafer, simultaneously as shown in FIG. 4A. Just after the two grooves 1 and 2 meet, the features begin etching back from the point of intersection of the {111} planes at a rapid rate. If left long enough, the sidewalls etch back to meet the other set of {111} planes forming a large cavity in the silicon, as shown in FIG. 4B; this is undesirable if a hole having a well defined diameter is needed.

SUMMARY OF THE INVENTION

Accordingly, an object of the present invention is to provide a process which forms exterior corners in a etchable substrate which do not etch back.

Another object of the present invention is to provide a process which forms exterior corners in a etchable substrate in circumstances where the standard corner compensation is not usable.

In accordance with the present invention, a process forms a three-dimensional structure etched in a substrate with perfect convex corners. Said structure is partitioned into two features so that the intersection of the sidewalls of the two features forms the convex corners. One etches the first feature, followed by forming an etch mask on the surface of the first etched feature. Then one opens a region (window) in the mask to be etched down to form the second feature and one etches the second feature, thereby obtaining the desired structure.

In one aspect of the invention, the region for the second feature surrounds at the substrate principal surface one end of the masked and passivated first feature, and the silicon beneath the surrounded end portion of the first feature is undercut by etching until the <111> planes defining the sidewalls of the first feature are met. The exterior corners formed by the intersection of the first etched feature and the now etched groove of the second feature do not etch back, since the corner is passivated by the etch mask on the principal surface defining the second feature.

In another aspect of the invention, to avoid performing a second lithography step after the first feature is etched, the second feature is first defined by a nitride mask. The remainder of the wafer (substrate) is then oxidized and the first feature is patterned. The wafer surface is still planar at this point and the mask photolithography step is therefore easy. After the first feature is etched, the wafer is oxidized. The nitride mask protects the mask region defining the second feature from oxidizing. So, after the entire wafer surface is plasma etched to remove the nitride mask, the original silicon surface is exposed without having to perform lithography on the uneven surface (which is clearly much harder since the interior oxide surface of the first etched feature must be completely protected during the lithography.) The wafer is again etched until the second feature etches out.

In a further aspect of the invention, a wafer is first etched from the top surface to form the first feature, followed by forming an etch mask on the top surface.

Then one opens a region defining the second feature on the masked bottom surface of the wafer and etches the second feature from the bottom surface, thereby obtaining a sharply defined intersection of the two features and a well defined hole after removing the etch masks.

The above and other objects, features and advantages of the present invention will be clear from the following description of the preferred embodiments in conjunction with the accompanying drawings.

DETAILED DESCRIPTION OF THE INVENTION

Figure 1A:
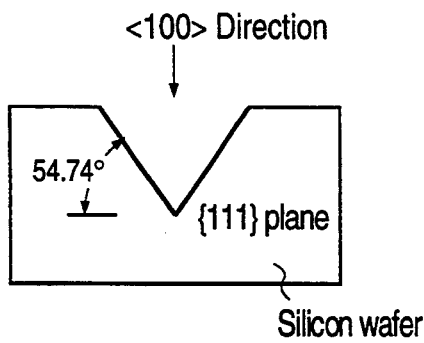
FIG. 1A is a cross-sectional view of a groove formed in a (100) wafer by anisotropic etching, showing the intersecting angle between a {111}plane and the (100) surface.
Figure 1B:
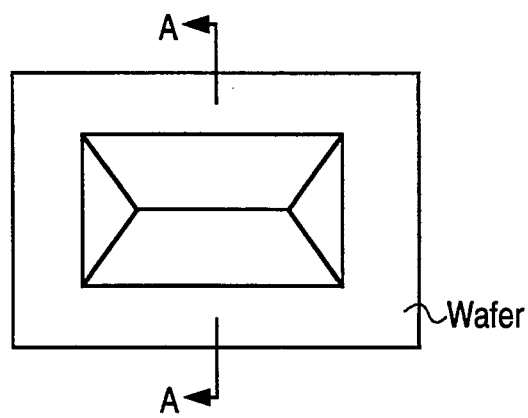
FIG. 1B is a plan view of FIG. 1 showing an etched groove formed from a rectangular window in the etch mask on the surface of the wafer.
Figure 2A:
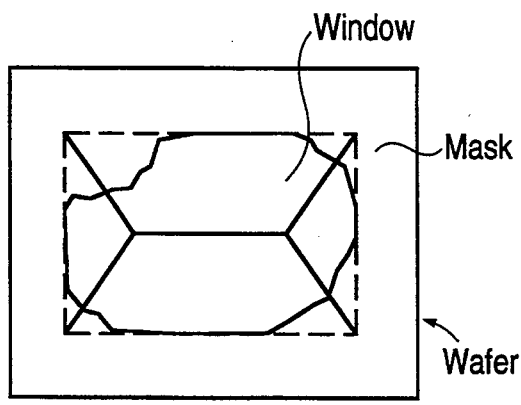
FIGS. 2A and 2B are top plan views showing opened windows on the mask which are more complicated than a rectangle, and resulting grooves.
Figure 2B:
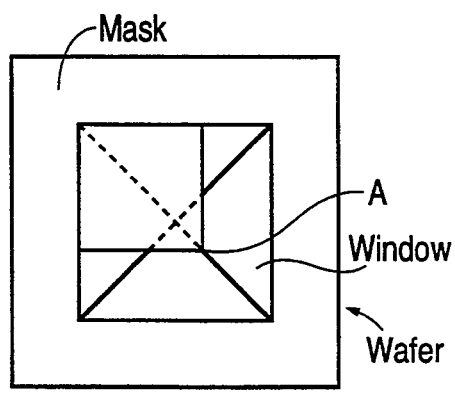
Figure 3A:
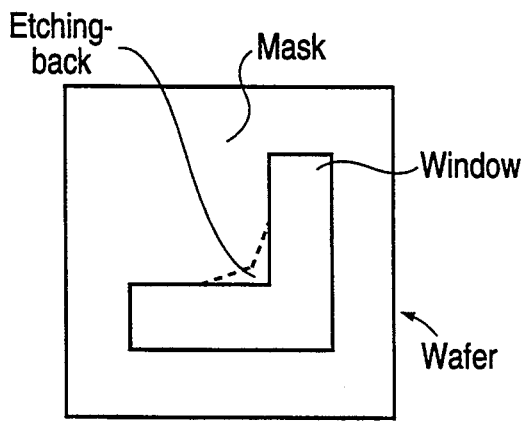
FIG. 3A is a view similar to FIG. 2B showing etching-back on the exterior (convex) corner.
Figure 3B:
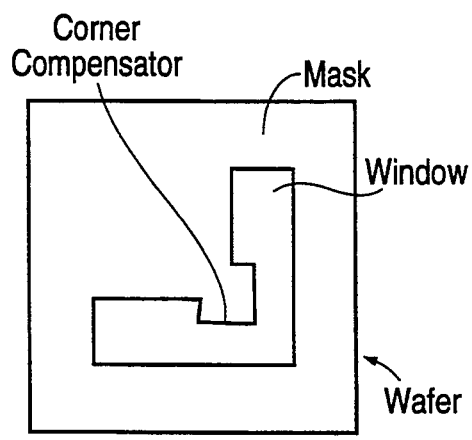
FIG. 3B is a view similar to FIG. 2B showing an added mask protrusion for corner compensation.
Figure 3C:
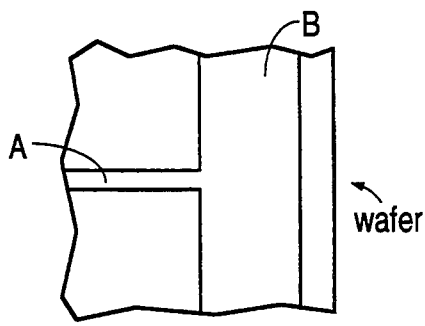
Figure 4A:
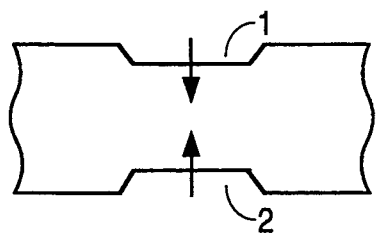
FIG. 4A is a cross-sectional view of a wafer showing simultaneous etching from the back and front side of the wafer in prior art.
Figure 4B:
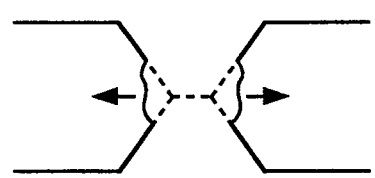
FIG. 4B is a view similar to FIG. 4A showing rapid etching-back from the point of intersection of the {111} planes.
Figure 5A:
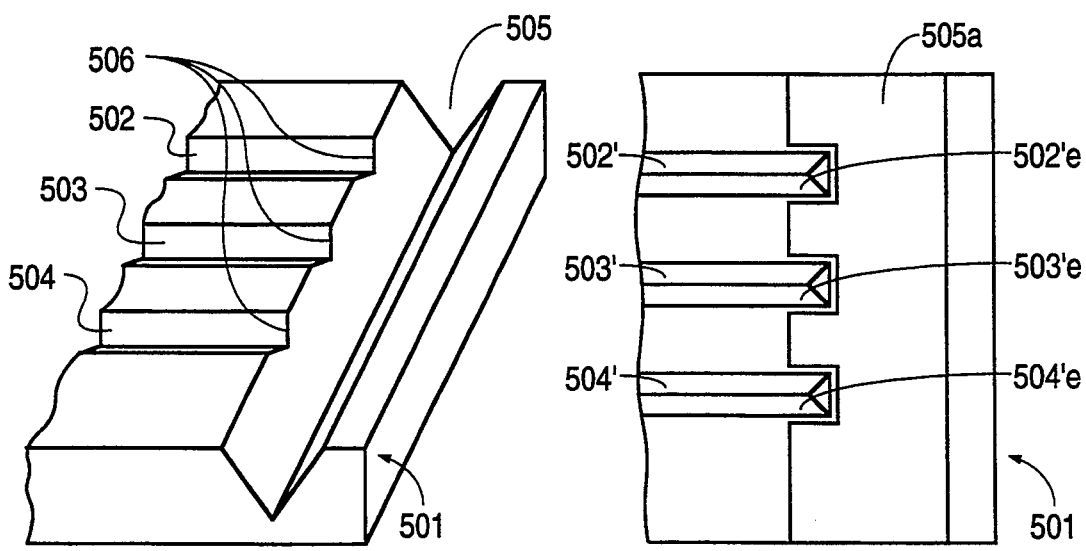
FIG. 5A is a partial perspective view of an etched wafer showing perfect exterior corners formed according to the present invention.
Figure 5B:
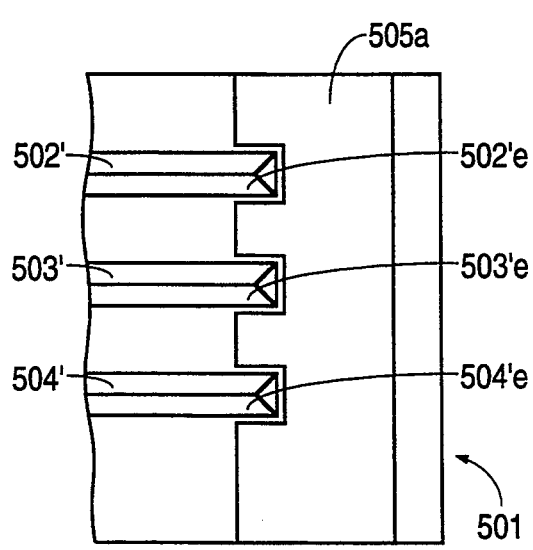
FIG. 5B is a top plan view of a wafer showing the shape of the window for the second groove after the first grooves are etched out.

FIG. 5A is a partial perspective view of an etched wafer. There are three horizontal V-grooves 502, 503 and 504 and a vertical groove 505, and the intention is to obtain sharp intersections 506 between the horizontal grooves 502, 503 and 504 and the vertical groove 505. (Horizontal and vertical are arbitrary designators here). According to the present invention, horizontal grooves 502', 503' and 504' are first etched in a (100) wafer. An end portion of each groove 502', 503', 504' protrudes into the region in which is to be formed the vertical groove 505, as shown in FIG. 5B with the sidewalls of each groove 502', 503', 504' formed by <111> planes. Then the wafer is oxidized to mask the etched horizontal grooves. After that, one opens in the mask a window pattern 505a for defining the vertical groove 505, which surrounds said end portions 502'E, 503'E and 504'E of the oxidized grooves 502', 503' and 504' and one etches the vertical groove 505. The silicon portion beneath the end portions 502'E, 503'E and 504'E of the horizontal grooves is undercut by the etch until the <111> planes defining the sidewalls of the horizontal grooves 502', 503' and 504' are met. The exterior corners formed by intersection of the horizontal grooves 502', 503' and 504' and the etching of vertical groove 505 do not etch back since these corners are passivated by the oxide mask in the sidewalls of the horizontal grooves 502', 503' and 504', thereby obtaining sharp intersections between the horizontal grooves 502, 503, 504 and the vertical groove 505.

In order to define the window pattern 505a for the vertical groove 505 after oxidization of the etched grooves 502', 503' and 504', a second lithography step is usually needed. This is difficult since the interior oxide surface of the horizontal grooves must be completely protected during the lithography.

Figure 6:
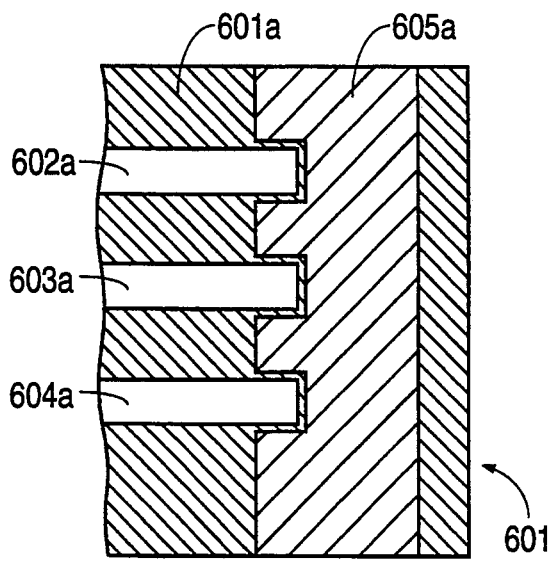
FIG. 6 is a top plan view of a wafer showing the second groove pattern defined in nitride and the first groove patterns defined in the oxide.

Nitride mask processes are used to simplify the process. One way to perform the process in accordance with the present invention is to define the vertical groove pattern 605a in silicon nitride first, as shown in FIG. 6. The remainder of the wafer 601 is then oxidized to grow oxide 601a, and the horizontal groove patterns 602a, 603a and 604a are defined on the oxide 601a, as shown in FIG. 6. Since the wafer is still planar at this point, the photolithography step is relatively easy. Then, one puts the wafer 601 in an etchant for etching the horizontal grooves 502', 503' and 504', and thereafter, the wafer is oxidized again. Since the nitride mask protects the vertical groove region 605a from oxidizing, the original silicon surface is exposed after the entire wafer surface is plasma etched in, for example, SF$_6$ gas to remove the nitride. The wafer is again etched in, for example, KOH and water until the vertical groove etches to the desired depth.

The structure shown in FIG. 5A can be used for instance in making flow restrictors. There, many quite small grooves which are used to trap little particles are connected to much larger and deeper flow channels. As mentioned previously, there is not enough room therefore for the standard corner compensation techniques.

Figure 7A:
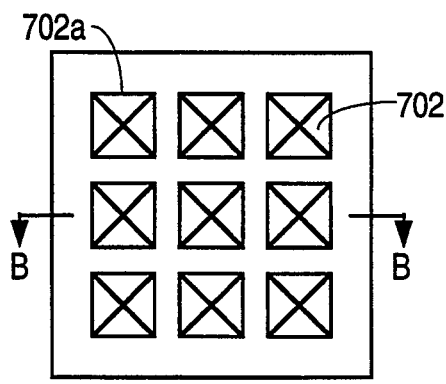
FIG. 7A is a top plan view of a wafer showing another embodiment of the present invention.
Figure 7B:
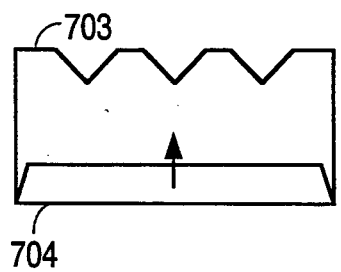
FIG. 7B is a cross-sectional view of FIG. 7 taken along line B—B just after the backside etch has started.
Figure 7C:
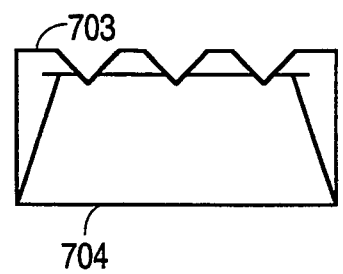
FIG. 7C is a cross-sectional view of FIG. 7 taken along line B—B after the etching from the bottom surface is completed.

Reference is now made to FIGS. 7a and 7b, which show another embodiment of the present invention. FIG. 7a is a top plan view of a silicon mesh in which holes of specified size are formed in a silicon wafer. This structure may be used for an atomizer for liquid droplets or for an alternate fluid particle filter. According to the present invention, a (100) wafer is patterned photographically on its top surface with an array of squares 702a as shown in FIG. 7A. The wafer is then etched from the top surface 703 until holes of each inverted pyramid shape 702 are etched out for each square 702a as shown in FIG. 7A and 7B, with the sidewalls of the pyramid 702 formed by <111> planes. Thereafter the whole wafer is oxidized so that oxide is grown on the surface of the etched holes. A large square window 704 which has the dimensions of the whole array of the etched holes 702a is then patterned photolithographically on the bottom side of the wafer. The wafer is etched again from the back side as shown in FIG. 7B where the heavy lines represent the silicon surface covered by the etch mask, for example, thermally grown silicon oxide. The etch is stopped when it reaches a predetermined depth as shown in FIG. 7C, which leaves well defined holes in the silicon after the etch mask is removed.

Figure 8A:
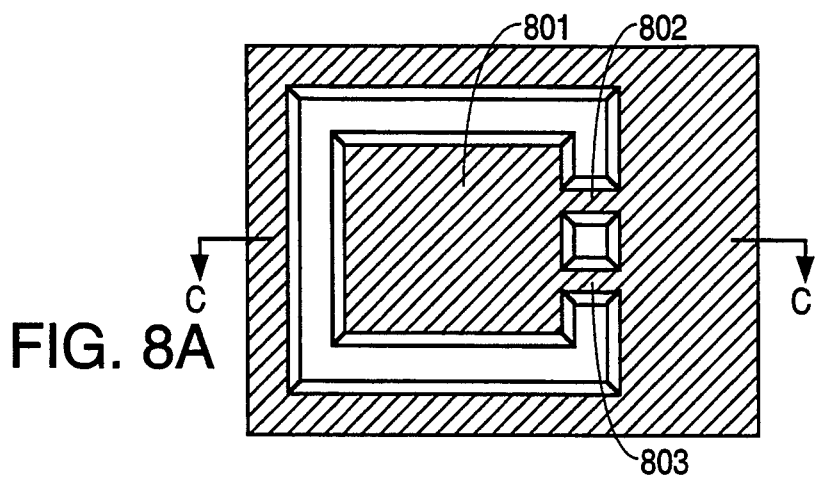
FIG. 8A is a top plan view of an accelerometer structure formed according to the present invention.
Figure 8B:
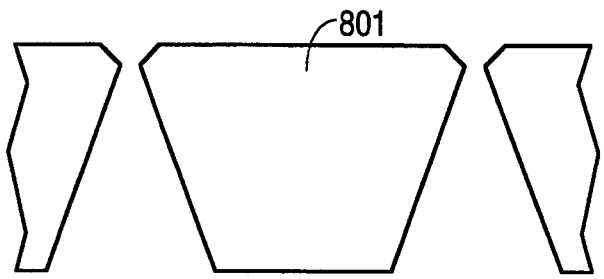
FIG. 8B is a cross-sectional view of FIG. 8A taken along line C—C in FIG. 8A.

This process can be used to advantage in the formation of accelerometer structures, where typically a silicon mass is freed from the surrounding silicon substrate, except for narrow or thin support beams, as shown in FIG. 8A and 8B. In FIG. 8A, which is a top plan view of a wafer, a silicon mass 801 is supported by support beams 802 and 803. FIG. 8B is a cross-sectional view of FIG. 8A taken along line C—C. Here the top etch can be performed first with appropriate corner compensation. After passivation of the surface of the etched feature, the bottom etch is performed, also with corner compensation. The bottom etch is stopped when the correct thickness of top support beams 802 and 803 is achieved.

The present invention has been described in its preferred embodiments. However, these embodiments are only illustrative, and do not limit the scope of the invention. It will be apparent to those skilled in the art that various variations and modifications can be made without departing from the spirit and the scope of the invention as hereinafter claimed.

For example, it is also possible to have multiple etches either in the embodiment of the present invention in conjunction with FIGS. 5A and 5B or in the embodiment in conjunction with FIGS. 7A and 7B, as long as the previous etched surface is passivated by an appropriate etch mask between each etch; the types of etch mask which are appropriate may include thermally grown silicon dioxide, chemically vapor deposited silicon nitride, evaporated or sputtered metal layers such as chrome or chrome-gold layers and diffused etch stops such as heavily doped boron layers; it is also possible to use an isotropic etchant, such as a mixture of nitric and hydrofluoric acid or plasma of sulfur hexafluoride, as one of the etches. Thus an isotopically etched groove, which does not need to be aligned to any particular silicon direction, can be etched first, followed by an anisotropic etch. The scope of the invention is limited only by the claims which follow.

What is claimed is:

1. A process for forming a three-dimensional structure having at least one exterior corner in an etchable substrate comprising:
   partitioning said structure into a first feature and a second feature, such that the exterior corners are formed by an intersection of the two features;
   etching said first feature;
   forming an etch mask on the surface and on the substrate of the etched first feature;
   opening a window in the etch mask on the substrate to define said second feature; and
   etching said second feature, thereby obtaining said exterior corner.

2. A process as defined in claim 1, wherein said window for the second feature surrounds at the substrate principal surface one end of the etched first feature.

3. A process as defined in claim 1, wherein said first feature is a set of parallel grooves and said second feature is a groove perpendicular to the set of parallel grooves.

4. A process as defined in claim 3, wherein said first and second grooves are V-shaped in cross section.

5. A process as defined in claim 4, wherein said set of grooves are narrower and shallower than said second feature.

6. A process as defined in claim 1, wherein the step of etching said first feature comprises isotropic etching.

7. A process for forming a three-dimensional structure having at least one exterior corner in an etchable substrate comprising:
   partitioning said structure into a first feature and a second feature such that said exterior corner is formed by the intersection of the two features;
   defining said second feature in a mask layer on a surface of said wafer;
   oxidizing the remainder of said wafer;
   patterning said first feature on said oxide;
   etching said first feature;
   oxidizing said wafer to grow oxide on the surface of the etched first feature;
   removing said mask layer; and
   etching said second feature, thereby obtaining said exterior corner.

8. A process as defined in claim 7, wherein said second feature as defined in the mask layer surrounds at the principal surface at the substrate one end of the etched first feature.

9. A process as defined in claim 7, wherein said first feature is a set of parallel grooves, and said second feature is a groove perpendicular to said set of parallel grooves.

10. A process as defined in claim 9, wherein said first and second grooves are V-shaped.

11. A process as defined in claim 10, wherein each of said set of grooves is narrower and shallower than said second feature.

12. A process as defined in claim 7, wherein the step of etching said first feature comprises isotropic etching.

13. A process as defined in claim 7, wherein the removing of said mask layer uses plasma etch.

* * * * *